US009040325B2

(12) United States Patent
Lin et al.

(10) Patent No.: US 9,040,325 B2
(45) Date of Patent: May 26, 2015

(54) METHOD FOR MANUFACTURING LIGHT EMITTING DIODE PACKAGE HAVING A VOLTAGE STABILIZING MODULE CONSISTING OF TWO DOPING LAYERS

(71) Applicant: ADVANCED OPTOELECTRONIC TECHNOLOGY, INC., Hsinchu Hsien (TW)

(72) Inventors: Hou-Te Lin, Hsinchu (TW); Chao-Hsiung Chang, Hsinchu (TW)

(73) Assignee: ADVANCED OPTOELECTRONIC TECHNOLOGY, INC., Hsinchu Hsien (TW)

(*) Notice: Subject to any disclaimer, the term of this patent is extended or adjusted under 35 U.S.C. 154(b) by 0 days.

(21) Appl. No.: 14/248,340

(22) Filed: Apr. 9, 2014

(65) Prior Publication Data
US 2014/0220718 A1    Aug. 7, 2014

Related U.S. Application Data

(62) Division of application No. 13/533,981, filed on Jun. 27, 2012, now Pat. No. 8,729,572.

(30) Foreign Application Priority Data

Jul. 8, 2011    (CN) .......................... 2011 1 0190981

(51) Int. Cl.
*H01L 21/00* (2006.01)
*H01L 27/15* (2006.01)
*H01L 25/16* (2006.01)
*H01L 33/08* (2010.01)

(52) U.S. Cl.
CPC ............ *H01L 27/153* (2013.01); *H01L 25/167* (2013.01); *H01L 2224/48091* (2013.01); *H01L 33/08* (2013.01); *H01L 2933/0033* (2013.01); *H01L 2933/005* (2013.01)

(58) Field of Classification Search
CPC ................. H01L 2924/00; H01L 2224/73265; H01L 2924/00014; H01L 33/62; H01L 25/167
USPC ......................................... 257/88; 438/28, 29
See application file for complete search history.

(56) References Cited

U.S. PATENT DOCUMENTS

2005/0274974 A1    12/2005   Kim et al.
2008/0224162 A1*   9/2008    Min et al. ........................ 257/98

(Continued)

FOREIGN PATENT DOCUMENTS

CN          1707762 A      12/2005
CN          102054829 A    5/2011

*Primary Examiner* — Kenneth Parker
*Assistant Examiner* — David Chen
(74) *Attorney, Agent, or Firm* — Novak Druce Connolly Bove + Quigg LLP

(57) ABSTRACT

A method for manufacturing an LED (light emitting diode) package comprises following steps: providing an electrically insulated base, the base having a first surface and a second surface opposite thereto; an annular voltage stabilizing module is formed on the first surface; a first electrode is formed on the first surface, wherein the first electrode is attached to and encircled by the voltage stabilizing module; a second electrode is formed on the first surface, wherein the second electrode is attached to and encircles the voltage stabilizing module; an LED chip is mounted on the first electrode, wherein the LED chip is electrically connected to the first and second electrodes, and the LED chip and the voltage stabilizing module are connected in reverse parallel. Finally, an encapsulative layer is brought to encapsulate the LED chip.

9 Claims, 3 Drawing Sheets

(56) References Cited

U.S. PATENT DOCUMENTS

| | | | |
|---|---|---|---|
| 2009/0152665 A1* | 6/2009 | Tseng et al. | 257/461 |
| 2010/0133557 A1* | 6/2010 | Kwon et al. | 257/88 |
| 2010/0320483 A1* | 12/2010 | Kadotani et al. | 257/88 |
| 2011/0031513 A1 | 2/2011 | Hsieh et al. | |
| 2011/0115055 A1* | 5/2011 | Niide et al. | 257/603 |

* cited by examiner

METHOD FOR MANUFACTURING LIGHT EMITTING DIODE PACKAGE HAVING A VOLTAGE STABILIZING MODULE CONSISTING OF TWO DOPING LAYERS

CROSS-REFERENCE TO RELATED APPLICATIONS

This patent application is a divisional application of patent application Ser. No. 13/533,981, filed on Jun. 27, 2012, entitled "LIGHT EMITTING DIODE PACKAGE HAVING A VOLTAGE STABILIZING MODULE CONSISTING OF TWO DOPING LAYERS", assigned to the same assignee, which is based on and claims priority from China Patent Application No. 201110190981.7, filed in China on Jul. 8, 2011, and disclosures of both related applications are incorporated herein by reference in their entireties.

BACKGROUND

1. Technical Field

The present disclosure relates to semiconductor devices and, more particularly, to a light emitting diode (LED) package and a method for manufacturing the LED.

2. Description of the Related Art

LEDs have many beneficial characteristics, including low electrical power consumption, low heat generation, long lifetime, small volume, good impact resistance, fast response and excellent stability. These characteristics have enabled the LEDs to be widely used as a light source in electrical appliances and electronic devices.

The LEDs are one-way conducting elements. If current flows through the LEDs in a forward direction, the LEDs emit light. If current flows through the LEDs in a reverse direction, the LEDs fail to emit light. In addition, the LEDs would be broken down if the reverse current is too large. There is unpredictable current, such that caused by static electricity, which may flow through the LEDs in the reverse direction during the operation of the LEDs. A voltage stabilizing diode such as a Zener diode, is therefore applied to the LEDs for preventing the LEDs from damage by such unpredictable current in the reverse direction. A typical design of the Zener diode is reverse parallel connecting the Zener diode with the LEDs via wires and positioning the Zener diode outside of the package of the LEDs. The reverse parallel connection means that the Zener diode is connected in parallel with LEDs while the Zener diode is reverse biased and the LEDs are forward biased. Such design has some deficiencies. For example, such a connection way results in a complicated structure, and a large volume of the LEDs. More importantly, such a connection way may not obtain a stable electrical connection between the Zener diode and the LEDs after the LEDs having been use for a certain time.

What is needed is an LED package and a method for manufacturing the LED package which can overcome the problem of the prior art.

DETAILED DESCRIPTION

Figure 1:
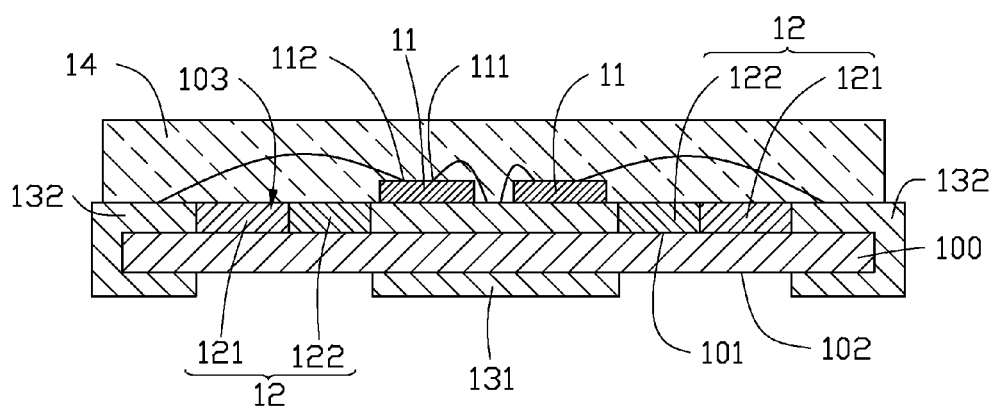
FIG. 1 is a section view of an LED package in accordance with an exemplary embodiment of the present disclosure.
Figure 2:
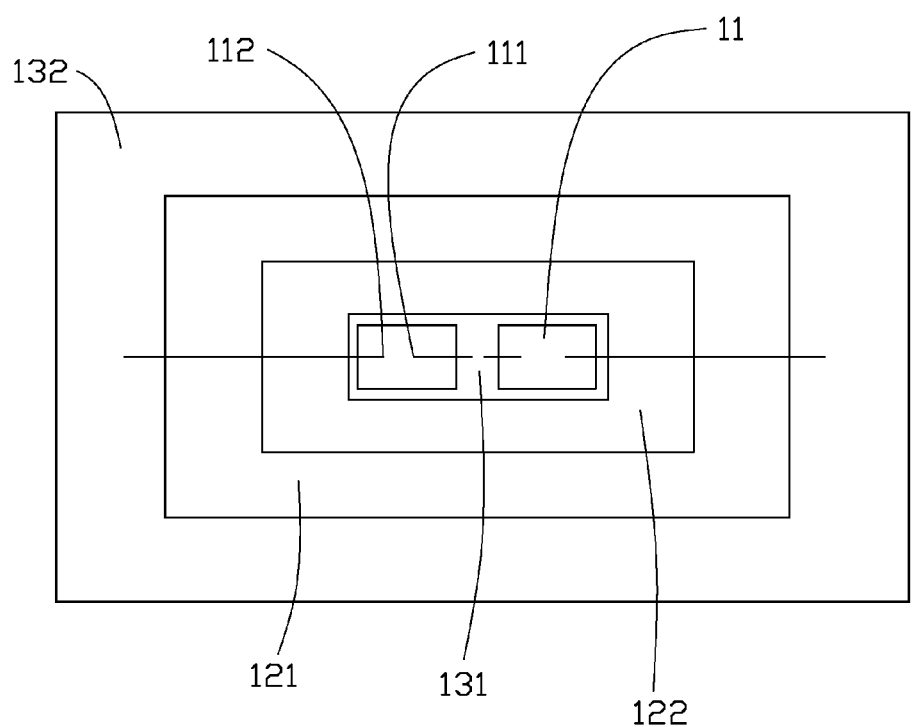
FIG. 2 is a top view of the LED package in accordance with the exemplary embodiment of the present disclosure.

Referring to FIGS. 1 and 2, a light emitting diode (LED) package in accordance with an exemplary embodiment of the present disclosure comprises an electrically insulated base 100, two LED chips 11, a voltage stabilizing module 12, a first electrode 131, a second electrode 132, and an encapsulative layer 14. The voltage stabilizing module 12 is formed on the base 100 and electrically connects to the first and second electrodes 131, 132. The LED chips 11 are mounted on the first electrode 131 and electrically connect to the first and second electrodes 131, 132. When the first and second electrodes 131, 132 electrically connect to a power source (not shown), the LED chips 11 have forward current flowing therethrough and emit light. The voltage stabilizing module 12 has a polarity arranged opposite to that of each of the LED chips 11. Thus, the irregular current or static electricity, if there is any during the operation of the LED chips 11, can be discharged by the voltage stabilizing module 12, and the LED chips 11 are prevented from damage. In the preferred embodiment, the first electrode 131 is connected to the positive pole of the power source, while the second electrode 132 is connected to the negative pole of the power source, whereby forward current can flow through the LED chips 11 to cause the LED chips 11 to emit light.

Specifically, the base 100 has a first surface 101 and a second surface 102 opposite to the first surface 101. A protrusion 103 extends upwardly and annularly from the first surface 101. The protrusion 103 can be formed by patternizing the first surface 101 via microlithography and etching. The base 100 may be made of the following one or more than one of the materials: Si, GaAs, ZnO and InP.

The voltage stabilizing module 12 can be formed by doping the protrusion 103 of the base 100 to convert the protrusion 103 into the voltage stabilizing module 12. The doping can by any type such as epitaxial dope, diffusing dope or ion-implantation. It is understood that the voltage stabilizing module 12 can be formed on the surface of the protrusion 103. The voltage stabilizing module 12 comprises a first doping layer 121 and a second doping layer 122. The first doping layer 121 is located beside the second doping layer 122. The first doping layer 121 and the second doping layer 122 have an identical thickness, and are in the same level. The first doping layer 121 is a P-type doping layer, and the second doping layer 122 is an N-type doping layer.

The first electrode 131 is positioned on a center portion of the first surface 101 of the base 100. The first electrode 131 has a rectangular shape. The first electrode 131 is encircled by the voltage stabilizing module 12. Specifically, the second doping layer 122 encircles and is attached to the first electrode 131, and the first doping layer 121 encircles and is attached to the second doping layer 122. The second electrode 132 encircles and is attached to the first doping layer 121.

The voltage stabilizing module 12 is such configured to electrically connect the first and second electrodes 131, 132, whereby when connecting with the power source, the LED chips 11 emit light, and the voltage stabilizing module 12 discharges the irregular current or static electricity. The second electrode 132 is formed on the first surface 101 of the base 100 and bends and extends to the second surface 102 of the base 100. The first electrode 131 can also penetrate through the base 100 and extend to the second surface 102 of the base 100; thus, the LED package can be formed as a surface mounting device.

Each of the LED chips 11 has two poles, i.e., anode pole 111 and cathode pole 112. The poles 111, 112 are electrically connected to the first and second electrodes 131, 132 respectively via metal wires (not labeled). The LED chips 11 can be only one, or can be more than two in an alternative embodiment. When connecting with the power source, the current of the power source is flown through the LED chips 11 for emitting light, while the irregular current or static electricity can be discharged by the voltage stabilizing module 12.

The encapsulative layer 14 is made of transparent or translucent materials. The encapsulative layer 14 is formed on the base 100 and encapsulates the LED chips 11. Phosphors can be contained in the encapsulative layer 14.

Compared with the conventional package structure, the LED package of the present disclosure provides the voltage stabilizing module 12 in an annular shape and in a position between the first and second electrodes 131, 132, the thickness and indeed the volume of the LED package is therefore decreased. Simultaneously, the annular voltage stabilizing module 12 positioned between the first and second electrodes 131, 132 ensures a stable connection therebetween; thus, the object of preventing the LED package from breaking down such as via static electricity is achieved. Furthermore, the LED package in accordance with the present disclosure is more durable and reliable.

Furthermore, the LED package can be formed as a surface mounting device thanks to the base 100 being formed of nonconductive materials, i.e., being insulated, and there is no need to form an insulating material on the base 100.

Figure 3:
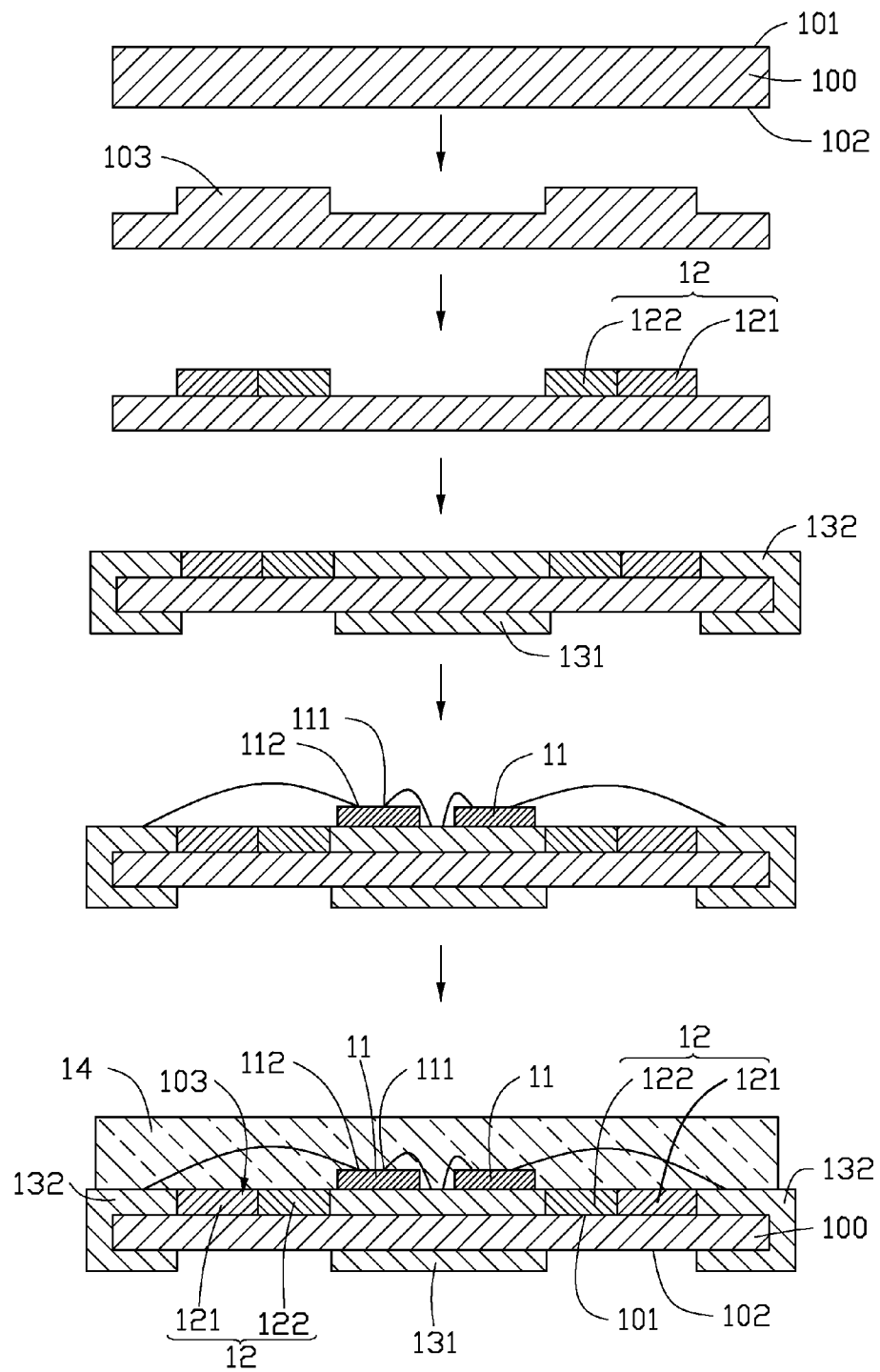
FIG. 3 shows a plurality of structures being made according to a flow chart of a method of manufacturing the LED package in accordance with the exemplary embodiment of the present disclosure.

A method of manufacturing the LED package of the present disclosure now will be described in detail hereinafter with reference to FIG. 3.

First, an electrically insulated base 100 is provided. The base 100 may be made of the following one or more than one of the materials: Si, GaAs, ZnO and InP. The base 100 has a first surface 101 and a second surface 102 opposite to the first surface 101. A protrusion 103 is extended upwardly and annularly from the first surface 101 by patternizing the first surface 101 via etching or microlithography.

Second, a first doping layer 121 and a second doping layer 122 are formed in the protrusion 103 by doping the protrusion 103 with two different elements or two types of different elements. An annular voltage stabilizing module 12 is thus formed and in the shape of the protrusion 103. The type of doping can be epitaxial doping or ion implantation. The first doping layer 121 is a P-type doping layer, and the second doping layer 122 is an N-type doping layer. The first doping layer 121 and the second doping layer 122 are arranged side by side. The first and second doping layers 121, 122 are positioned in a same level and have an identical thickness.

Third, a first electrode 131 is formed on a center portion of the first surface 101 of the base 100. The first electrode 131 is encircled by and attached to the second doping layer 122 of the voltage stabilizing module 12. The first electrode 131 penetrates through the base 100 and extends to the second surface 102 of the base 100. A second electrode 132 is formed on a periphery portion of the first surface 101 of the base 100. The second electrode 132 encircles and is attached to the first doping layer 121 of the voltage stabilizing module 12. The second electrode 132 bends and extends to the second surface 102 of the base 100. The first electrode 131 and the second electrode 132 are electrically insulated from each other on the second surface 102 of the base 100.

Fourth, two LED chips 11 are mounted on the first electrode 131. The LED chips 11 are electrically connected to the first and second electrodes 131, 132 via wire bonding. The voltage stabilizing module 12 connects to the LED chips 11 in reverse parallel. The voltage stabilizing module 12 has a polarity opposite to that of the LED chips 11; that is, when connecting a power source to the LED package, the anode of the power source connects to the anode pole 111 of the LED chip 11 via the first electrode 131, which connects with a P-type semiconductor layer of the LED chip 11, while the anode of the power source connects to the second doping layer 122 of the voltage stabilizing module 12 via the first electrode 131, which is an N-type doping layer (i.e., an N-type semiconductor layer).

At last, an encapsulative layer 14 is formed on the base 100 and covers the LED chips 11. The encapsulative layer 14 is made of transparent or translucent materials. Phosphors can be contained in the encapsulative layer 14.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing an LED (light emitting diode) package comprising following steps:
   providing an electrically insulated base, the base having a first surface and a second surface opposite to the first surface;
   forming an annular voltage stabilizing module on the first surface of the base;
   forming a first electrode on the first surface of the base, the first electrode being attached to and encircled by the voltage stabilizing module;
   forming a second electrode on the first surface of the base, the second electrode being attached to and encircling the voltage stabilizing module;
   mounting at least one LED chip on the first electrode, the at least one LED chip being electrically connected to the first and second electrodes, the at least one LED chip and the voltage stabilizing module being connected in reverse parallel; and
   encapsulating the at least one LED chip with an encapsulative layer.

2. The method of claim 1, wherein the voltage stabilizing module comprises a first doping layer and a second doping layer, the first and second doping layers being respectively doped with two different or two kinds of different elements, whereby the first doping layer being a P-type doping layer and the second doping layer being an N-type doping layer.

3. The method of claim 2, wherein the first doping layer is attached to and encircles the second doping layer, and the second doping layer is attached to and encircles the first electrode.

4. The method of claim 3, wherein the second electrode is attached to and encircles the first doping layer.

5. The method of claim 2, wherein an annular protrusion is formed on the first surface of the base via microlithography and etching, and the first doping layer and the second doping layer are formed by the protrusion via a doping process.

6. The method of claim 5, wherein the doping process is epitaxial dope, diffusing dope or ion-implantation.

7. The method of claim 1, wherein the base is made of the following one or more than one of the materials: Si, GaAs, ZnO and InP.

8. The method of claim 1, wherein the second electrode bends and extends to the second surface of the base.

9. The method of claim 1, wherein the first electrode penetrates through and extends to the second surface of the base, the first and second electrodes are electrically insulated from each other on the second surface of the base.

* * * * *